(12) United States Patent
Park et al.

(10) Patent No.: US 8,860,012 B2
(45) Date of Patent: Oct. 14, 2014

(54) TEXTILE-TYPE ORGANIC LIGHT-EMITTING DEVICE AND METHOD OF MANUFACTURING THE SAME

(75) Inventors: Jong-jin Park, Hwaseong-si (KR); Jung-kyun Im, Yongin-si (KR); Sang-won Kim, Seoul (KR); Chwee Lin Choong, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/490,127

(22) Filed: Jun. 6, 2012

(65) Prior Publication Data

US 2013/0140599 A1   Jun. 6, 2013

(30) Foreign Application Priority Data

Dec. 2, 2011   (KR) .................. 10-2011-0128530

(51) Int. Cl.
     *H01L 51/56*   (2006.01)
(52) U.S. Cl.
     USPC ........................................................ 257/40
(58) Field of Classification Search
     USPC ........................................................ 257/40
     See application file for complete search history.

(56) References Cited

U.S. PATENT DOCUMENTS

| | | | | |
|---|---|---|---|---|
| 6,538,375 | B1 * | 3/2003 | Duggal et al. ............... | 313/506 |
| 6,753,096 | B2 * | 6/2004 | Duggal et al. ............... | 428/690 |
| 7,079,748 | B2 * | 7/2006 | Arkhipov et al. ............ | 385/141 |
| 7,194,173 | B2 * | 3/2007 | Shtein et al. ................. | 385/128 |
| 7,385,220 | B2 * | 6/2008 | Granstrom et al. .......... | 257/40 |
| 7,535,019 | B1 * | 5/2009 | Sager et al. .................. | 257/43 |
| 7,894,694 | B2 * | 2/2011 | Gaudiana et al. ............ | 385/101 |
| 2004/0031977 | A1 * | 2/2004 | Brown et al. ................. | 257/222 |
| 2004/0263072 | A1 * | 12/2004 | Park et al. .................... | 313/509 |
| 2005/0127455 | A1 * | 6/2005 | Nishiki et al. ............... | 257/390 |
| 2006/0013549 | A1 | 1/2006 | Shtein et al. | |
| 2006/0017059 | A1 * | 1/2006 | Strip et al. ................... | 257/99 |
| 2013/0146860 | A1 * | 6/2013 | Toyama ....................... | 257/40 |

FOREIGN PATENT DOCUMENTS

| | | |
|---|---|---|
| JP | 2006-12760 A | 1/2006 |
| KR | 2002-0047889 A | 6/2002 |
| KR | 10-2005-0099027 A | 10/2005 |
| KR | 10-2006-0090454 A | 8/2006 |
| KR | 10-2007-0076521 A | 7/2007 |
| KR | 100786842 B1 | 12/2007 |
| KR | 10-0811502 B1 | 3/2008 |
| KR | 1020080072660 A | 8/2008 |
| KR | 10-2009-0122022 A | 11/2009 |
| KR | 10-2010-0102773 A | 9/2010 |
| KR | 10-2011-0033953 A | 4/2011 |

OTHER PUBLICATIONS

G. Parthasarathy, et al; "A metal-free cathode for organic semiconductor devices"; Applied Physics Letters; vol. 72; No. 17; Apr. 27, 1998; pp. 2138-2140.

(Continued)

*Primary Examiner* — Eugene Lee
(74) *Attorney, Agent, or Firm* — Sughrue Mion, PLLC

(57) ABSTRACT

A textile-type organic light-emitting device and a method of manufacturing the textile-type organic light-emitting device are provided. The light-emitting device includes a textile-type first electrode; an organic light-emitting material layer formed on a surface of the textile-type first electrode; and a second electrode formed on the organic light-emitting material layer, the second electrode being transparent.

17 Claims, 4 Drawing Sheets

(56) References Cited

OTHER PUBLICATIONS

S. Han; "Transparent-cathode for top-emission organic light-emitting diodes"; Applied Physics Letters; vol. 82; No. 16; Apr. 21, 2003; pp. 2715-2717; 4 sheets.

Jong Tae Lim; "Top-Emitting Organic Light-Emitting Diodes Using Cs/Al/Ag Cathodes"; Japanese Journal of Applied Physics; vol. 46; No. 7A; Jul. 4, 2007; pp. 4296-4299.

Simone Hofmann et al; "Top-emitting organic light-emitting diodes: Influence of cavity design"; Applied Physics Letters; vol. 97; Dec. 23, 2010; pp. 253308-1-253308-3; 4 sheets.

Chieh-Wei Chen; "Novel Bottom Cathode Structure for Inverted Top-Emitting Organic Light-Emitting Devices"; Proc. Int. Symp. Super-Functionality Organic Devices; IPAP Conf. Series 6; Mar. 30, 2005; pp. 114-116.

Jose M. Moran-Mirabal; "Electrospun Light-Emitting Nanofibers"; NANO Letters; vol. 7; No. 2; Jan. 23, 2007; pp. 458-463.

Sung-Yeon Jang; "Welded Electrochromic Conductive Polymer Nanofibers by Electrostatic Spinning"; Advanced Materials; vol. 17; Aug. 8, 2005; pp. 2177-2180.

Jong Tae Lim; "Top-Emitting Organic Light-Emitting Diodes Using Cs/Al/Ag Cathodes"; Japanese Journal of Applied Physics; vol. 46; No. 7A; Jul. 4, 2007; pgs. 4296-4299.

Chieh-Wei Chen; "Novel Bottom Cathode Structure for Inverted Top-Emitting Organic Light-Emitting Devices"; Proc. Int. Symp. Super-Functionality Organic Devices; IPAP Conf. Series 6; pp. 114-116.

Hyunsu Cho; "Highly transparent organic light-emitting diodes with a metallic top electrode: the dual role of a $Cs_2CO_3$ layer"; Optics Express; vol. 19; No. 2; Jan. 17, 2011; pp. 1113-1121.

\* cited by examiner

TEXTILE-TYPE ORGANIC LIGHT-EMITTING DEVICE AND METHOD OF MANUFACTURING THE SAME

CROSS-REFERENCE TO RELATED APPLICATIONS

This application claims priority from Korean Patent Application No. 10-2011-0128530, filed on Dec. 2, 2011, in the Korean Intellectual Property Office, the disclosure of which is incorporated herein in its entirety by reference.

BACKGROUND

1. Field

Apparatuses and methods consistent with exemplary embodiments relate to methods and apparatuses for an organic light-emitting device, and more particularly, to a top-emission textile-type organic light-emitting device and a method of manufacturing the same.

2. Description of the Related Art

An organic light-emitting device is a self-emission type display that uses a phenomenon in which, when a current is supplied to an organic emission layer formed of fluorescent or phosphorescent organic compound, electrons and holes are combined in the organic emission layer so that light is produced therefrom. The organic light-emitting device may produce a high-quality moving picture, wide viewing angles, high color purity, and the like, and may be usefully applied to portable electronic devices due to its low power consumption. Also, a thin organic light-emitting device can be made to easily embody a flexible display. The organic light-emitting device is classified as a bottom-emission organic light-emitting device in which light produced by an organic emission layer is emitted via a transparent anode electrode on a substrate, or a top-emission organic light-emitting device in which light produced by the organic emission layer is emitted via a transparent cathode electrode. In general, the bottom-emission organic light-emitting device has an aperture ratio of about 50% maximum, and the top-emission organic light-emitting device has an aperture ratio between about 60% and about 70%. Thus, a top-emission type display having a high aperture ratio and a large selection of a thin film transistor (TFT) design may be applied to an active matrix organic light-emitting device. In the description, a textile-type display indicates flexible displays formed by weaving fibers having a multilayer structure. The textile-type display has high bend and flexibility according to materials, so that a top-emission organic light emitting device may be embodied on a textile-type substrate.

SUMMARY

One or more exemplary embodiments pay provide a textile-type organic light-emitting device and a method of manufacturing the same.

Additional aspects will be set forth in part in the description which follows and, in part, will be apparent from the description, or may be learned by practice of exemplary embodiments.

According to an aspect of an exemplary embodiment, a textile-type organic light-emitting device includes a textile-type first electrode comprising a woven arrangement of fibers; an organic light-emitting material layer formed on a surface of the textile-type first electrode; and a second electrode being transparent and formed on the organic light-emitting material layer.

The organic light-emitting material layer and the second electrode may be formed on a top surface of the textile-type first electrode, whereby light produced by the organic light-emitting material layer may be emitted via the second electrode.

The textile-type first electrode and the second electrode may be an anode electrode and a cathode electrode, respectively.

The fibers of the textile-type first electrode may each include a textile fiber core and a conductive layer coated on an exterior surface of the textile fiber core. The textile fiber core may include polymer. The conductive layer may include at least one metal layer. The conductive layer may include at least one of Ni, Cu, and Au. The fibers of the textile-type first electrode may be formed of a conductive material.

The second electrode may have a transmittance that is equal to or greater than about 80%. The second electrode may include at least one metal layer. The second electrode may include two or more metal materials. The second electrode may include Mg and Ag.

A hole transport layer (HTL) may be formed between the textile-type first electrode and the organic light-emitting material layer. An electron transport layer (ETL) may be formed between the organic light-emitting material layer and the second electrode. The ETL may include Li.

An electrode protection layer may be further formed on the second electrode. Here, the electrode protection layer may include LiF.

According to an aspect of another exemplary embodiment, a method of manufacturing a textile-type organic light-emitting device includes operations of forming a textile-type first electrode including a woven arrangement of fibers; depositing an organic light-emitting material layer on a top surface of the textile-type first electrode; and depositing a transparent second electrode on the organic light-emitting material layer.

The operation of forming the textile-type first electrode may include an operation of coating at least one metal layer on an exterior surface of textile fiber core by using an electroless plating method.

BRIEF DESCRIPTION OF THE DRAWINGS

These and/or other exemplary aspects will become apparent and more readily appreciated from the following description of exemplary embodiments, taken in conjunction with the accompanying drawings in which.

DETAILED DESCRIPTION

Figure 1:
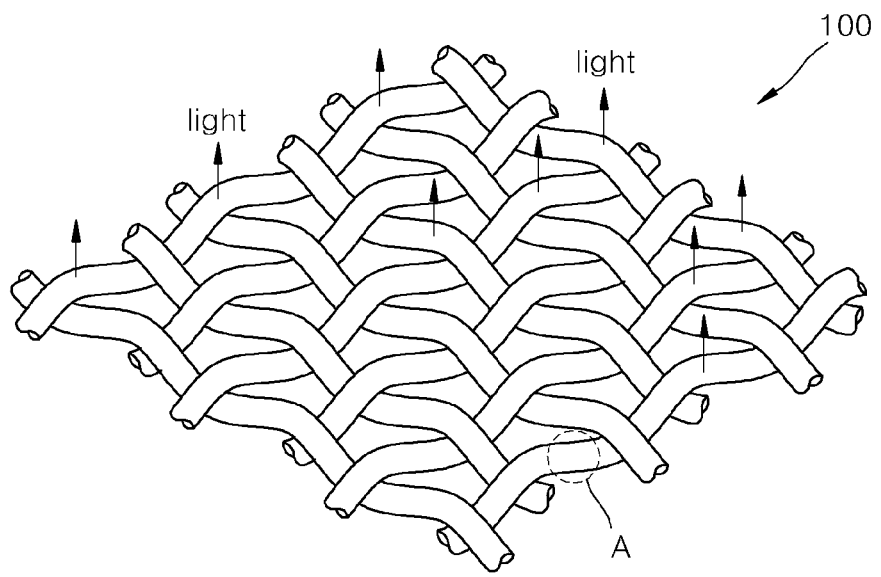
FIG. 1 is a perspective view of a textile-type organic light-emitting device according to an exemplary embodiment.

Reference will now be made in detail to exemplary embodiments which are illustrated in the accompanying drawings, wherein like reference numerals refer to like elements throughout. In the drawings, the size and the thickness of each component may be exaggerated for clarity.

Expressions such as "at least one of," when preceding a list of elements, modify the entire list of elements and do not modify the individual elements of the list.

Figure 2:
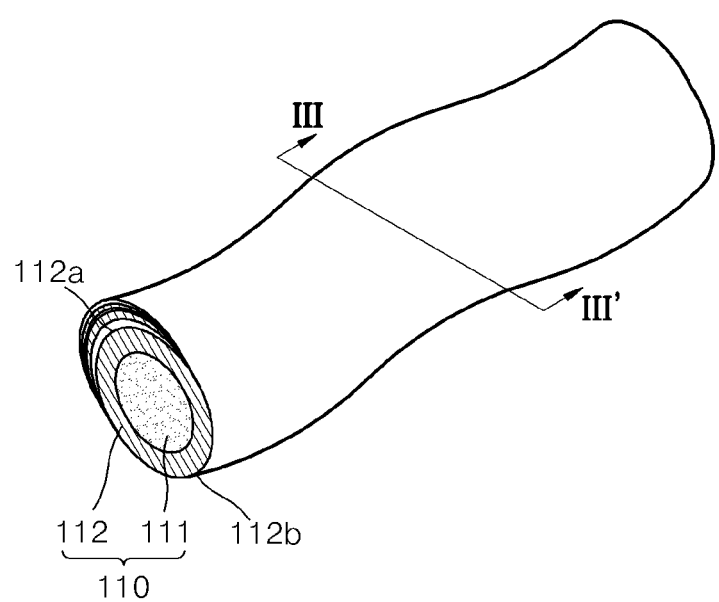
FIG. 2 illustrates a cut portion of a portion A of FIG. 1.
Figure 3:
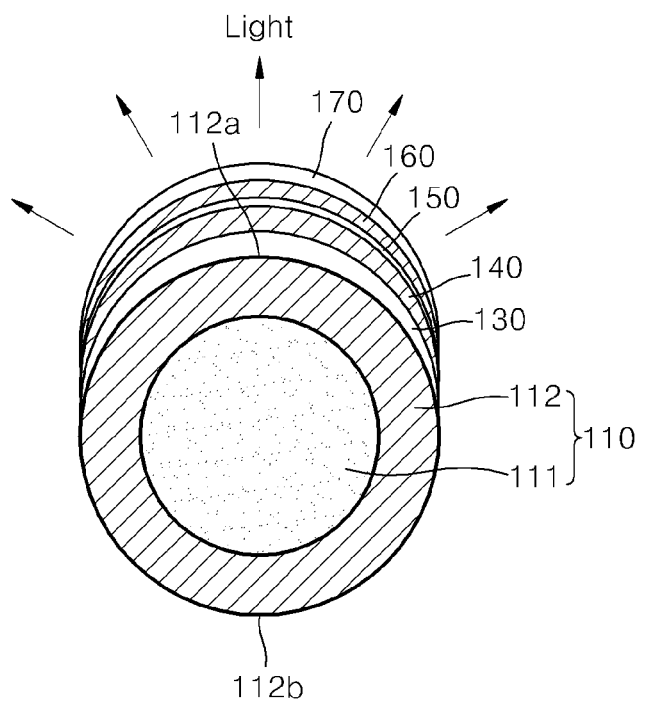
FIG. 3 is a cross-sectional view of the portion A of FIG. 2, taken along a line III-III'.
Figure 4:
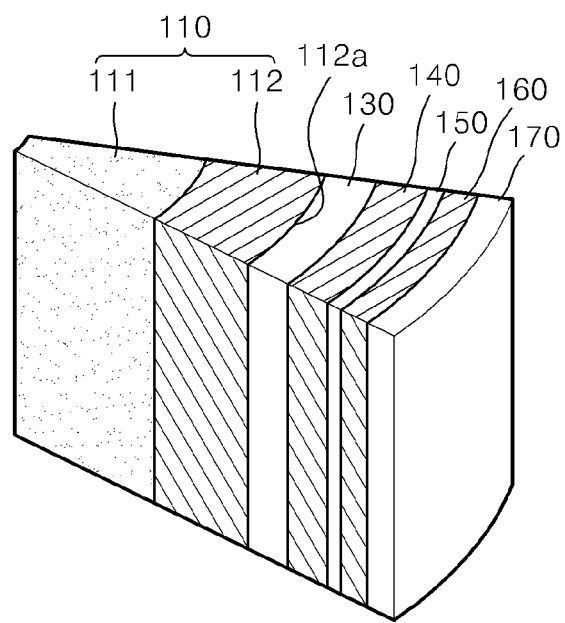
FIG. 4 is a perspective view of the portion A of FIG. 2.

FIG. 1 is a perspective view of a textile-type organic light-emitting device 100 according to an exemplary embodiment. FIG. 2 illustrates a cut portion of a portion A of FIG. 1. FIG. 3 is a cross-sectional view of the portion A of FIG. 2, taken along a line III-III'. FIG. 4 is a perspective view of a portion of the portion A of FIG. 2.

Referring to FIGS. 1 through 4, the textile-type organic light-emitting device 100 includes a textile-type first electrode 110, an organic light-emitting material layer 140 formed on the textile-type first electrode 110, and a second electrode 160 that is transparent and is formed on the organic light-emitting material layer 140. Also, a hole transport layer (HTL) 130 may be further formed between the textile-type first electrode 110 and the organic light-emitting material layer 140, and an electron transport layer (ETL) 150 may be further formed between the organic light-emitting material layer 140 and the second electrode 160.

The textile-type first electrode 110 may be an anode electrode. Here, the textile-type first electrode 110 may include a flexible textile fiber core 111, and a conductive layer 112 coated on the textile fiber core 111. The textile fiber core 111 may have a two-dimensional form in which a plurality of fiber strands are woven according to a predetermined pattern. For example, the textile fiber core 111 may include polymer, such as polystyrene, polyester, polyurethane, and the like. However, examples of the textile fiber core 111 are not limited thereto, and the textile fiber core 111 may be formed of one of various materials. A diameter of the textile fiber core 111 may be adjusted according to necessity. For example, the diameter of the textile fiber core 111 may be between about 20 μm and about 150 μm but is not limited thereto.

The conductive layer 112 may be coated to completely cover an entire exterior surface of the textile fiber core 111. For example, a thickness of the conductive layer 112 may be between about 100 nm and about 1 μm. The conductive layer 112 may include at least one metal layer. The conductive layer 112 may include at least one of Ni, Cu, and Au. For example, the conductive layer 112 may include at least one of a Ni layer coated on the textile fiber core 111, a Cu layer coated on the textile fiber core 111, a Ni/Cu layer structure sequentially coated on the textile fiber core 111, and a Ni/Au layer structure sequentially coated on the textile fiber core 111. However, one or more embodiments of the present invention are not limited thereto, and the conductive layer 112 may include various metal materials other than the aforementioned materials and may include one of various structures. Also, the conductive layer 112 may include another material than the aforementioned metal materials, e.g., the conductive layer 112 may include indium tin oxide (ITO).

The conductive layer 112 of the textile-type first electrode 110 may have a relatively high work function, compared to the second electrode 160, which is a cathode electrode. For example, the conductive layer 112 may have a work function between about 4.8 eV and about 5.1 eV. In the present embodiment, the textile-type first electrode 110 includes the textile fiber core 111 and the conductive layer 112 coated on the exterior surface of the textile fiber core 111. However, in another embodiment, the textile-type first electrode 110 may be formed of only a textile fiber (not shown) including a conductive material.

The HTL 130 may be formed on the textile-type first electrode 110. The HTL 130 may be formed on a top surface (specifically, a top surface 112a of the conductive layer 112 in FIG. 3) of the textile-type first electrode 110. In FIGS. 2 and 3, a reference numeral 112b indicates a bottom surface of the conductive layer 112. The HTL 130 facilitates hole transportation between the textile-type first electrode 110 and the organic light-emitting material layer 140. The HTL 130 may include a hole transporting material used in a general organic light-emitting device. For example, the HTL 130 may include carbazole derivatives such as N-phenylcarbazole, polyvinyl carbazole, or the like, or general aromatic condensed ring amine derivatives such as N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or the like. However, materials of the HTL 130 are not limited thereto.

The organic light-emitting material layer 140 may be formed on the HTL 130. Thus, the organic light-emitting material layer 140 may also be formed on the top surface of the textile-type first electrode 110. The organic light-emitting material layer 140 may include a blue, green, or red light-emitting material layer. Also, the organic light-emitting material layer 140 may include two complementary color layers or a white emitting material layer including blue, green, and red light-emitting material layers. The organic light-emitting material layer 140 may be formed of a host material, by using a fluorescent or phosphorescent material as a dopant. The host material may be any material that is used in general organic light-emitting devices. For example, the host material may include 9,10-di-(2-naphthyl) anthracene (ADN), 2-(1,1-dimethyethyl)-9,10-bis(2-naphthalenyl) anthracene (TBADN), tris-(8-hydroxyquinoline) aluminum ($Alq_3$), or the like. The organic light-emitting material layer 140 may have a thickness between about 30 nm and about 100 nm. However, the thickness of the organic light-emitting material layer 140 is not limited thereto.

The ETL 150 may be formed on the organic light-emitting material layer 140. The ETL 150 facilitates electron transportation between the organic light-emitting material layer 140 and the second electrode 160. In the present embodiment, the ETL 150 may include Li. However, the ETL 150 may include various materials other than Li, e.g., the ETL 150 may include an oxazole-based compound, an isoxazole-based compound, a triazole-based compound, an isothiazole-based compound, an oxadiazole-based compound, a thiadiazole-based compound, a perylene-based compound, an aluminum complex, or a gallium complex. However, materials of the ETL 150 are not limited thereto.

The transparent second electrode 160 may be formed on the ETL 150. Accordingly, similar to the organic light-emitting material layer 140, the second electrode 160 may also be formed on the top surface of the textile-type first electrode 110. The second electrode 160 is a cathode electrode and may be formed of a material of which transmittance is equal to or greater than about 80%. The second electrode 160 may have a work function that is relatively smaller than that of the conductive layer 112 of the textile-type first electrode 110. For example, the second electrode 160 may have a work function between about 3.8 eV and about 4.2 eV. The second electrode 160 may include two or more metal materials. Also, the second electrode 160 may include at least one metal layer. For example, the second electrode 160 may be formed as an Mg layer and an Ag layer that are sequentially stacked on the ETL 150. Here, each of the Mg layer and the Ag layer may have a thickness of about 10 nm but is not limited thereto. Alternatively, the second electrode 160 may be formed as a single layer including an alloy of Mg and Ag. Alternatively, the second electrode 160 may include various metal materials other than Mg and Ag. An electrode protection layer 170 may be further formed on the second electrode 160. The electrode protection layer 170 may include LiF but a material of the electrode protection layer 170 is not limited thereto.

In the textile-type organic light-emitting device 100 having the aforementioned structure, when a voltage is applied between the textile-type first electrode 110, which is an anode electrode, and the second electrode 160, which is a cathode electrode, holes flow from the textile-type first electrode 110 (specifically, the conductive layer 112) into the organic light-emitting material layer 140 via the HTL 130, and electrons flow from the second electrode 160 into the organic light-emitting material layer 140 via the ETL 150. Then, excitons are generated by recombination of the electrons and the holes in the organic light-emitting material layer 140, and when the excitons radioactively decay, light of a predetermined color is emitted. In the present embodiment, the organic light-emitting material layer 140 and the second electrode 160 are both formed on the top surface of the textile-type first electrode 110, so that the light of a predetermined color generated in the organic light-emitting material layer 140 is emitted via the second electrode 160 and the electrode protection layer 170. Thus, the textile-type organic light-emitting device 100 may be a top-emission organic light-emitting device.

As described above, forming the first electrode 110 of the textile-type organic light-emitting device 100, which is an anode electrode, as a textile-type structure, enables an easy formation of a flexible display. Also, by forming the organic light-emitting material layer 140 on the top surface of the textile-type first electrode 110, and by forming the second electrode 160 on the organic light-emitting material layer 140, a top-emission textile-type organic light-emitting device 100 having improved emission efficiency can be formed. The textile-type organic light-emitting device 100 may be applied to various display devices including a smart curtain, a smart window, or the like.

In the present embodiment, the HTL 130 is formed between the textile-type first electrode 110 and the organic light-emitting material layer 140, and the ETL 150 is formed between the organic light-emitting material layer 140 and the second electrode 160. However, in another embodiment, only one of the HTL 130 and the ETL 150 may be formed, or both the HTL 130 and the ETL 150 may not be formed.

Hereinafter, a method of manufacturing the textile-type organic light-emitting device 100 is described. FIGS. 5 through 8 describe a method of manufacturing the textile-type organic light-emitting device 100, according to an exemplary embodiment. For convenience of description, FIGS. 7 and 8 only illustrate cross-sections of the textile-type organic light-emitting device 100.

Figure 5:
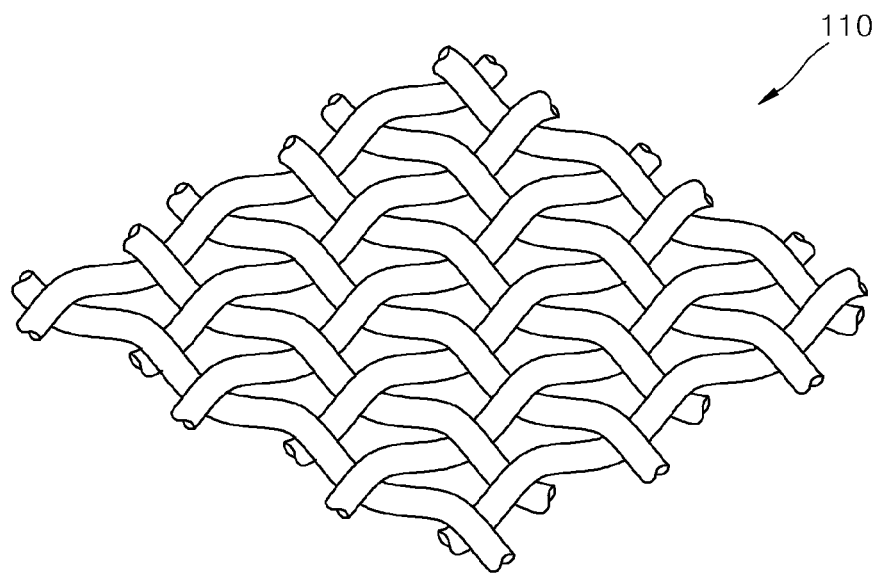
FIGS. 5 through 8 describe a method of manufacturing the textile-type organic light-emitting device 100, according to an exemplary embodiment.
Figure 6:
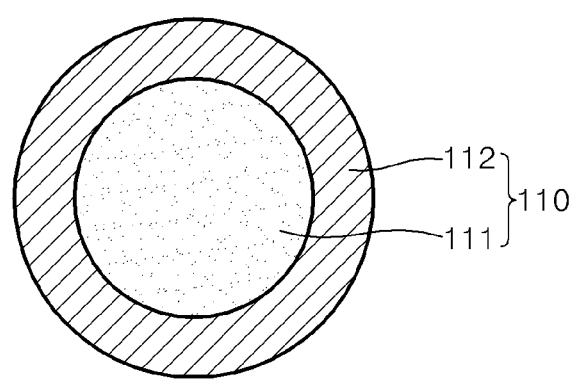

FIG. 5 is a perspective view of the textile-type first electrode 110 and FIG. 6 is a cross-sectional view of the textile-type first electrode 110 of FIG. 5.

Referring to FIGS. 5 and 6, the textile-type first electrode 110 is manufactured. The textile-type first electrode 110 may be an anode electrode. The textile-type first electrode 110 may include the flexible textile fiber core 111, and the conductive layer 112 coated on the textile fiber core 111. The textile-type first electrode 110 may be formed by coating the conductive layer 112 on an entire exterior surface of the textile fiber core 111 by using an electroless plating method. The textile fiber core 111 has a two-dimensional form in which a plurality of fiber strands are woven according to a predetermined pattern. For example, the textile fiber core 111 may include polymer, such as polystyrene, polyester, polyurethane, and the like. A diameter of the textile fiber core 111 may be between about 20 μm and about 150 μm but is not limited thereto.

The conductive layer 112 may be coated on the entire exterior surface of the textile fiber core 111 to a thickness between about 100 nm and about 1 μm. The conductive layer 112 may include at least one of Ni, Cu, and Au. For example, the conductive layer 112 may include at least one of a Ni layer coated on the textile fiber core 111, a Cu layer coated on the textile fiber core 111, a Ni/Cu layer structure sequentially coated on the textile fiber core 111, and a Ni/Au layer structure sequentially coated on the textile fiber core 111. However, one or more embodiments are not limited thereto, and the conductive layer 112 may include various metal materials other than the aforementioned materials and may include one of various structures. Also, the conductive layer 112 may include another material than the aforementioned metal materials and may include one of various layer structures.

Figure 7:
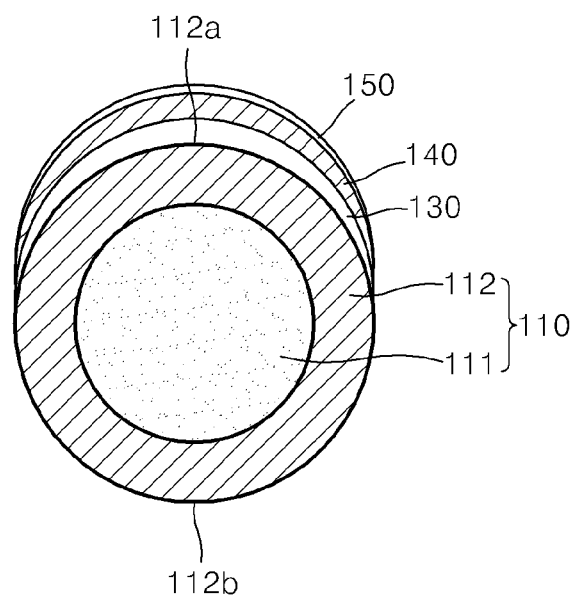

FIG. 7 is a cross-sectional view illustrating an example in which the HTL 130, the organic light-emitting material layer 140, and the ETL 150 are sequentially deposited on a top surface of the textile-type first electrode 110 illustrated in FIGS. 5 and 6.

Referring to FIG. 7, the HTL 130 is deposited on the top surface of the textile-type first electrode 110 (in more detail, the top surface 112a of the conductive layer 112 coated on the exterior surface of the textile fiber core 111). The HTL 130 may be formed by performing a method that is commonly used to manufacture a general organic light-emitting device, e.g., the HTL 130 may be formed by a vacuum deposition method. That is, a hole transporting material is vacuum-deposited on the textile-type first electrode 110 to form HTL 130 on the top surface 112a of the conductive layer 112. The HTL 130 may include a hole transporting material used in a general organic light-emitting device. For example, the HTL 130 may include carbazole derivatives such as N-phenylcarbazole, polyvinyl carbazole, or the like, or general aromatic condensed ring amine derivatives such as N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or the like. However, materials of the HTL 130 are not limited thereto.

Then, the organic light-emitting material layer 140 having a predetermined thickness is formed on the HTL 130. The organic light-emitting material layer 140 may be formed by performing a method that is commonly used to manufacture a general organic light-emitting device, e.g., the organic light-emitting material layer 140 may be formed by a vacuum deposition method. That is, when an organic emission material is vacuum-deposited on the HTL 130, the organic light-emitting material layer 140 may be formed on the HTL 130. The organic light-emitting material layer 140 may be formed of a host material, by using a fluorescent or phosphorescent material as a dopant. The host material may be any material that is used in general organic light-emitting devices. For example, the host material may include 9,10-di-(2-naphthyl) anthracene (ADN), 2-(1,1-dimethyethyl)-9,10-bis(2-naphthalenyl)anthracene (TBADN), tris-(8-hydroxyquinoline) aluminum ($Alq_3$), or the like. The organic light-emitting material layer 140 may have a thickness between about 30 nm and about 100 nm. However, the thickness of the organic light-emitting material layer 140 is not limited thereto.

Afterward, the ETL 150 is formed on the organic light-emitting material layer 140. The ETL 150 may be formed by performing a method that is commonly used to manufacture a general organic light-emitting device, e.g., the ETL 150 may be formed by a vacuum deposition method. That is, an electron transporting material is vacuum-deposited on the organic light-emitting material layer 140 to form the ETL 150 on the organic light-emitting material layer 140. The ETL 150 may include Li. However, the ETL 150 may include various materials other than Li, e.g., the ETL 150 may include an oxazole-based compound, an isoxazole-based compound, a triazole-based compound, an isothiazole-based compound, an oxadiazole-based compound, a thiadiazole-based compound, a perylene-based compound, an aluminum complex, or a gallium complex. However, materials of the ETL 150 are not limited thereto.

Figure 8:
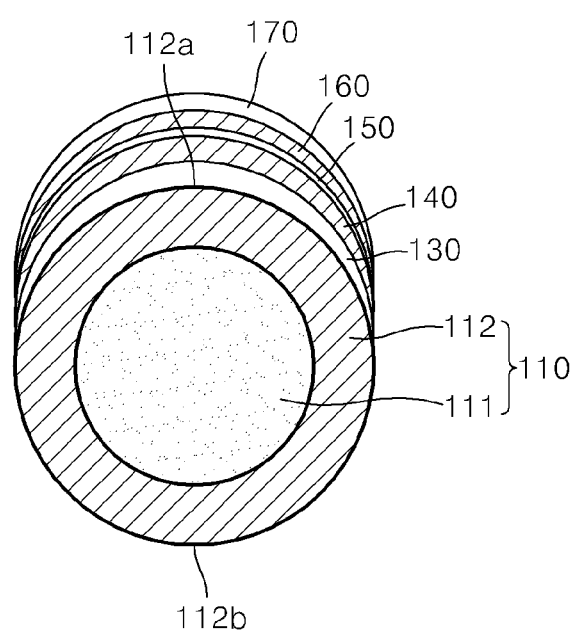

FIG. 8 is a cross-sectional view illustrating an example in which the second electrode 160 and the electrode protection layer 170 are sequentially formed on the ETL 150 of FIG. 7 in the stated order.

Referring to FIG. 8, the transparent second electrode 160 is deposited on the ETL 150. Here, the second electrode 160 may be a cathode electrode and may be formed of a material of which transmittance is equal to or greater than about 80%. The second electrode 160 may include two or more metal materials. Also, the second electrode 160 may include at least one metal layer. For example, the second electrode 160 may be formed as an Mg layer and an Ag layer that are sequentially stacked on the ETL 150. Here, each of the Mg layer and the Ag layer may have a thickness of about 10 nm but is not limited thereto. Alternatively, the second electrode 160 may be formed as a single layer including an alloy of Mg and Ag. Alternatively, the second electrode 160 may include various metal materials other than Mg and Ag. The second electrode 160 may be formed by a thermal deposition method, similar to a low-molecule deposition method. As described above, the second electrode 160 may be formed via a low-temperature process, to prevent damage to an organic material layer during a deposition process. Then, the electrode protection layer 170 is deposited on the second electrode 160. The electrode protection layer 170 may be formed by vacuum-depositing LiF on the second electrode 160.

The textile-type organic light-emitting device 100 may be encapsulated by atomic layer deposition (ALD). In the present embodiment, the HTL 130 is formed between the textile-type first electrode 110 and the organic light-emitting material layer 140, and the ETL 150 is formed between the organic light-emitting material layer 140 and the second electrode 160. However, in another embodiment, only one of the HTL 130 and the ETL 150 may be formed, or both the HTL 130 and the ETL 150 may not be formed.

According to the one or more exemplary embodiments, by forming an anode electrode having a textile-type structure, a flexible textile-type organic light-emitting device may be easily manufactured. Also, by forming an organic light-emitting material layer and a transparent cathode electrode on a top surface of the anode electrode, the top-emission textile-type organic light-emitting device has improved emission efficiency. The top-emission textile-type may be applied to various textile-type display devices including a smart curtain, a smart window, or the like.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. An organic light-emitting device comprising:
a first electrode comprising a woven arrangement of fibers;
an organic light-emitting material layer formed on only a portion of a surface of the first electrode; and
a second electrode formed on the organic light-emitting material layer, wherein the second electrode is transparent.

2. The organic light-emitting device of claim 1, wherein the organic light-emitting material layer is formed on a top surface of the first electrode, the second electrode is formed on a top surface of the organic light-emitting material layer, and light emitted by the organic light-emitting material layer is transmitted through the second electrode.

3. The organic light-emitting device of claim 1, wherein the first electrode is an anode and the second electrode is a cathode.

4. The organic light-emitting device of claim 1, wherein each of the fibers of the first electrode comprises a textile fiber core and a conductive layer coated on an exterior surface of the textile fiber core.

5. The organic light-emitting device of claim 4, wherein the textile fiber core comprises a polymer.

6. The organic light-emitting device of claim 4, wherein the conductive layer comprises at least one metal layer.

7. The organic light-emitting device of claim 6, wherein the conductive layer comprises at least one of Ni, Cu, and Au.

8. The organic light-emitting device of claim 1, wherein ead of the fibers of the first electrode is formed of only a textile fiber including a conductive material.

9. The organic light-emitting device of claim 1, wherein the second electrode has a transmittance that is equal to or greater than about 80%.

10. The organic light-emitting device of claim 1, wherein the second electrode comprises at least one metal layer.

11. The organic light-emitting device of claim 10, wherein the second electrode comprises two or more metal materials.

12. The organic light-emitting device of claim 11, wherein the second electrode comprises Mg and Ag.

13. The organic light-emitting device of claim 1, further comprising a hole transport layer formed between the textile-type first electrode and the organic light-emitting material layer.

14. The organic light-emitting device of claim 1, further comprising an electron transport layer (ETL) formed between the organic light-emitting material layer and the second electrode.

15. The organic light-emitting device of claim 14, wherein the ETL comprises Li.

16. The organic light-emitting device of claim 14, further comprising an electrode protection layer formed on the second electrode.

17. The organic light-emitting device of claim 16, wherein the electrode protection layer comprises LiF.

\* \* \* \* \*